(12) United States Patent
Hosokawa

(10) Patent No.: US 11,003,164 B2
(45) Date of Patent: May 11, 2021

(54) METHODS FOR ALIGNING A PHYSICAL LAYER TO A PATTERN FORMED VIA MULTI-PATTERNING, AND ASSOCIATED SYSTEMS

(71) Applicant: Micron Technology, Inc., Boise, ID (US)

(72) Inventor: Kohei Hosokawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/556,927

(22) Filed: Aug. 30, 2019

(65) Prior Publication Data

US 2021/0063997 A1   Mar. 4, 2021

(51) Int. Cl.
*H01L 23/544* (2006.01)
*G05B 19/4097* (2006.01)
(Continued)

(52) U.S. Cl.
CPC ...... *G05B 19/4097* (2013.01); *H01L 21/0337* (2013.01); *G03F 7/70633* (2013.01);
(Continued)

(58) Field of Classification Search
CPC ...... G05B 19/4097; G05B 2219/45031; H01L 2224/08121; H01L 2224/80121–80132; H01L 2224/81121–81132; H01L 2224/82121–82132; H01L 2224/83121–83132; H01L 2224/84121–84132; H01L 2224/85121–85132; H01L 2224/86121–86132; H01L 2224/95121–95134; H01L 2021/60075;
(Continued)

(56) References Cited

U.S. PATENT DOCUMENTS 4,566,193 A * 1/1986 Hackleman ............... G01B 7/31
33/1 D
6,841,889 B2 * 1/2005 Baggenstoss ....... G03F 7/70458
257/797
(Continued)

FOREIGN PATENT DOCUMENTS

WO   WO-2007026174 A2 *   3/2007   ........... H05K 3/4664

OTHER PUBLICATIONS

Ban et al., Self-Aligned Double-Patterning Layout Decomposition for Two-Dimensional Random Metals for Sub-10-nm Node Design, Journal of Micro/Nanolithography, MEMS, and MOEMS, vol. 14, No. 1, (Jan.-Mar. 2015), pp. 011004-1-01004-15.
(Continued)

*Primary Examiner* — Jarrett J Stark
(74) *Attorney, Agent, or Firm* — TraskBritt

(57) ABSTRACT

Methods of aligning a number of physical layers to a pattern formed via multi-patterning are disclosed. A method may include determining a misalignment vector between a first layer and a second layer used to form a pattern via multi-patterning. The method may also include calculating, based on the misalignment vector between the first layer and the second layer, a center position of the pattern. Further, the method may include aligning a third layer to center position of the pattern. A computing system and a processing system are also described.

25 Claims, 13 Drawing Sheets

(51) Int. Cl.
*H01L 21/033* (2006.01)
*G03F 7/20* (2006.01)
(52) U.S. Cl.
CPC .. *G05B 2219/45031* (2013.01); *H01L 23/544* (2013.01); *H01L 2223/544* (2013.01); *H01L 2223/54426* (2013.01)
(58) Field of Classification Search
CPC ... H01L 2224/767–76756; H01L 2224/40993; H01L 2224/40998; H01L 2224/777–77756; H01L 2224/26135; H01L 2224/26165; H01L 2224/2499–24998; H01L 2021/60067–6009; H01L 2021/10135; H01L 2021/10165; H01L 2224/0213; H01L 2224/0217; H01L 2224/0224; H01L 21/0337; H01L 23/544; H01L 2223/54426; B81C 3/004; B81C 2203/051; G03F 7/70633
See application file for complete search history.

(56) References Cited

U.S. PATENT DOCUMENTS

| | | | |
|---|---|---|---|
| 7,913,197 B1 | 3/2011 | Kruger et al. | |
| 8,623,754 B1 * | 1/2014 | Ryan | H01L 23/488 438/613 |
| 2001/0034108 A1 * | 10/2001 | Komuro | H01L 22/34 438/401 |
| 2005/0186692 A1 * | 8/2005 | Olsson | G03F 7/70283 438/16 |
| 2008/0127031 A1 * | 5/2008 | Olsson | G03F 7/70283 716/54 |
| 2009/0032948 A1 * | 2/2009 | Hsieh | H01L 24/49 257/738 |
| 2010/0112467 A1 | 5/2010 | Chung | |
| 2010/0295153 A1 * | 11/2010 | Chu | H01L 23/5223 257/532 |
| 2012/0007214 A1 * | 1/2012 | Chu | H01L 23/5223 257/532 |
| 2012/0244461 A1 * | 9/2012 | Nagai | G03F 7/70525 430/30 |
| 2013/0060354 A1 * | 3/2013 | Choi | G05B 13/04 700/51 |
| 2014/0356982 A1 * | 12/2014 | Barash | H01L 22/20 438/5 |
| 2017/0235233 A1 * | 8/2017 | Lee | G03F 7/70633 355/67 |
| 2017/0262443 A1 * | 9/2017 | Cho | G06F 16/164 |
| 2018/0095450 A1 * | 4/2018 | Lappas | G06T 19/00 |
| 2018/0175016 A1 * | 6/2018 | Kim | G03F 7/70633 |
| 2019/0384101 A1 * | 12/2019 | Sakai | G02F 1/1339 |

OTHER PUBLICATIONS

Bubke et al., Mask Characterization for Double Patterning Lithography, Journal of Micro/Nanolithography, MEMS, and MOEMS, vol. 8, No. 1, (2009), 10 pages.

Seidel et al., Correlation Method Based Mask to Mask Overlay Metrology for 32nm Node and Beyond, Proc. of SPIE, Vo. 7985, 13 pages.

* cited by examiner

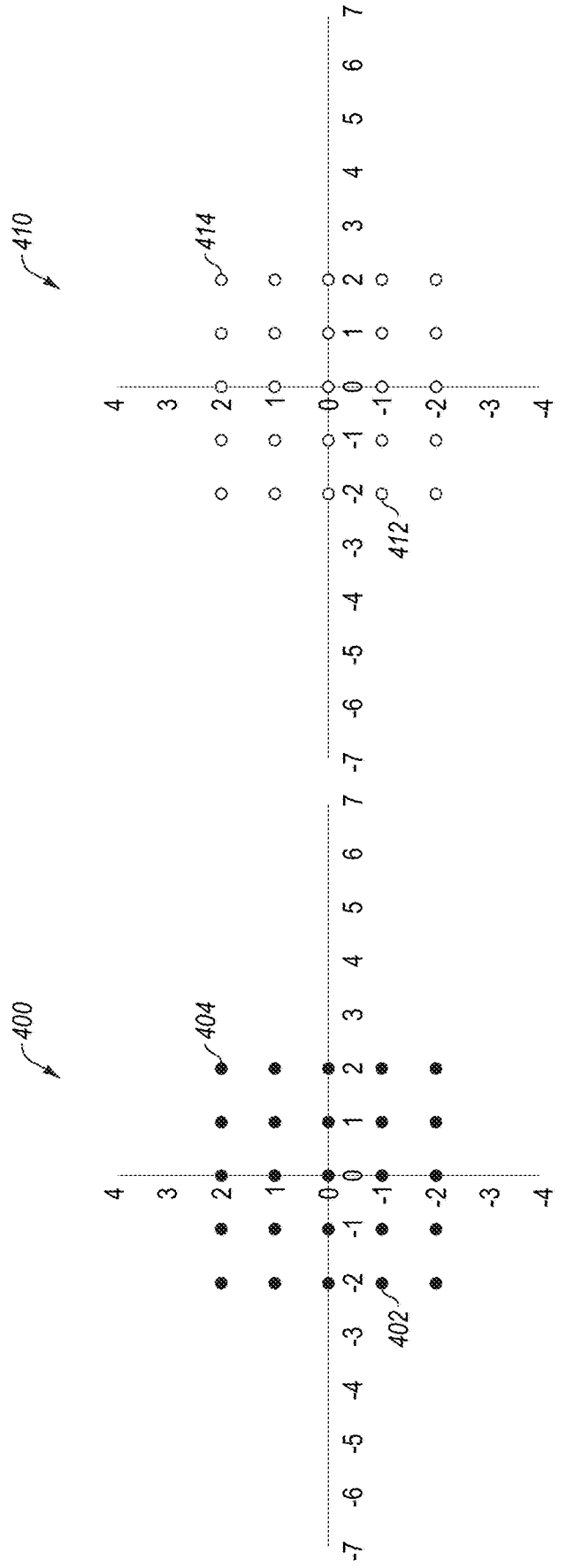

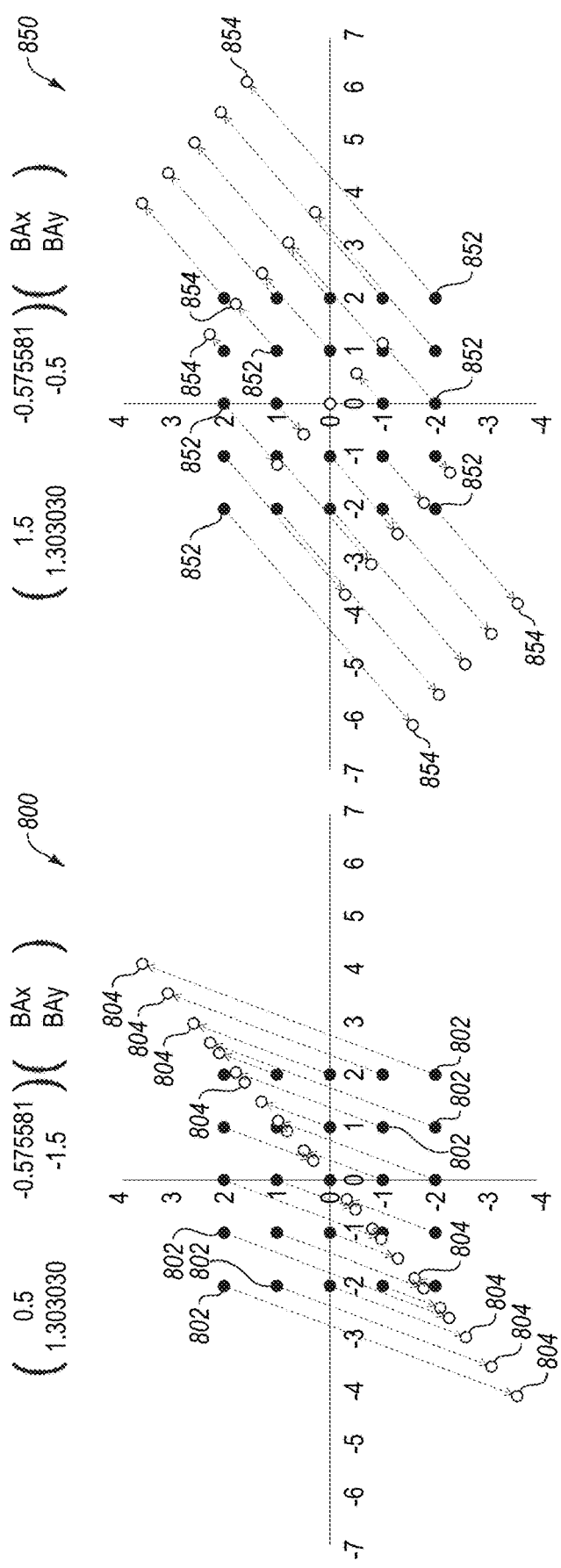

US 11,003,164 B2

METHODS FOR ALIGNING A PHYSICAL LAYER TO A PATTERN FORMED VIA MULTI-PATTERNING, AND ASSOCIATED SYSTEMS

TECHNICAL FIELD

Embodiments of the disclosure relate to semiconductor fabrication and, more specifically, to methods of aligning a physical layer to a pattern formed via multi-patterning. Yet more specifically, some embodiments relate to methods of determining a center of a pattern formed via one or more multi-patterning operations, and aligning a physical layer to the center of the pattern, and related systems.

BACKGROUND

Photolithography, which is a process commonly used in integrated circuit (IC) fabrication, may be used create two-dimensional patterns on a substrate via controlled application of energy (e.g., electromagnetic, ion beam, or other radiation) to a reactive material, or resist, deposited on the substrate. As geometries in substrate processing continue to shrink, technical challenges to forming structures on substrates increase. One technique for achieving suitable photolithography for increasingly small critical dimensions involves multi-patterning techniques to provide for pitch splitting. Such multi-patterning techniques include, for example, double patterning (i.e., involving two pattern layers), triple patterning (i.e., involving three pattern layers), and quadruple patterning (i.e., involving four pattern layers). In a multi-patterning process, a target pattern, which is not printable in a single lithography step, is decomposed into multiple pattern layers of smaller pitches that can be printed by a single lithography step. In the case of double patterning, the target pattern is decomposed into a first pattern layer and a second pattern layer.

With the evolution of multi-patterning photolithography, another challenge in IC fabrication includes aligning consecutive structures (e.g., layers and/or patterns) of an IC to ensure proper electrical contact between structures of an IC. Without proper alignment, the IC may not perform to specification, if at all.

BRIEF DESCRIPTION OF THE SEVERAL VIEWS OF THE DRAWINGS

FIG. 4A includes a plot depicting example measured error values.

FIG. 4B includes a plot depicting correction values for the measured error values shown in FIG. 4A.

FIG. 8A includes a plot illustrating example measured error values transformed to correction values for a layer, in accordance with various embodiments of the present disclosure.

FIG. 8B includes a plot illustrating example measured error values transformed to correction values for another layer, according to various embodiments of the present disclosure.

DETAILED DESCRIPTION

As described above, geometries in substrate processing continue to shrink. This trend applies to memory devices (e.g., semiconductor-based, integrated circuits in computers or other electronic system) to meet demands for increased portability, computing power, memory capacity, and energy efficiency. For example, decreasing feature size is evident in dynamic random access memories (DRAM), Flash memory, static random access memories (SRAM), ferroelectric (FE) memories, etc. For example, DRAM may include many thousands of identical device components in the form of memory cells. By decreasing the sizes of the electrical device structures that comprise a memory cell and the widths and lengths of the conducting lines to access the memory cells, memory devices can be made smaller. Additionally, storage capacities can be increased by fitting more memory cells on a given area in a memory device.

The continual reduction in feature sizes places greater demands on techniques used to form the features. Photolithography, as mentioned above, is commonly used to pattern features, such as conductive lines and pads. The concept of pitch can be used to describe the sizes of these features. Pitch may be defined as the distance between identical points in two neighboring features. These features are typically defined by spaces between adjacent features, which spaces are typically filled by a material, such as an insulator. As a result, pitch can be considered as the sum of the width of a feature and of the width of the space on one side of the feature separating that feature from a neighboring feature. However, due to factors such as limitations of optics and usable light or other radiation wavelengths, photolithography techniques have a minimum achievable pitch, below which a particular photolithographic technique cannot reliably form features. Thus, the minimum pitch of a photolithographic technique is an obstacle to continued feature size reduction.

Feature size shrinkage to increase the bit density continues to move forward over the resolution limits of state-of-the-art photolithography scanners. To form device patterns below resolution limits (e.g., below 37 nm half-pitch), various multi-patterning photolithography techniques are evolving. However, as will be appreciated, the specification of overlay control (e.g., to align layers within a layer-to-layer registration tolerance) has become more strict.

Figure 1:
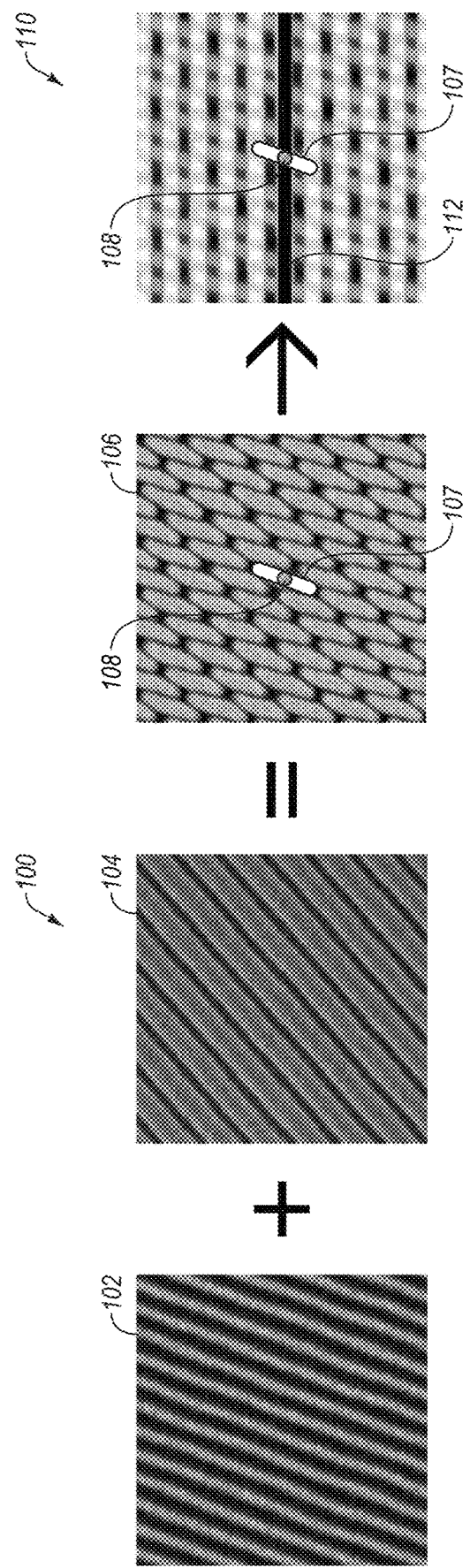
FIG. 1 illustrates a shallow trench isolation module and a word line module.

Various modules, such as shallow trench isolation (STI) modules, bit contact modules, redistribution layer (RDL) modules, and capacitor modules, are formed via a combination of several layers (e.g., in one or more multi-patterning operations). With reference to FIG. 1, an STI module 100 is depicted. STI module 100 includes an active line layer 102, an active chop (AC) layer 104, and an active area (AA) 106 including a pattern 107 having a center 108. For example, active line layer 102 includes a pitch quadrupled active line pattern below 18 nm half pitch, and AC layer 104 includes a pitch doubled space pattern. As will be appreciated, pattern 107 is formed by a combination of active line layer 102 and AC layer 104 (i.e., via one or more multi-patterning operations). More specifically, AC layer 104 may "chop" an active line in layer 102 to form "island-shaped" pattern 107 on active area 106. Pattern 107, which is formed via multi-patterning photolithography, is not a physical layer.

To form a semiconductor component, such as a memory cell, a layer in another module (e.g., a word line (WL) module, a bit contact (BC) module, or a digit line (DL) module) should align directly to a center of a pattern of an active area. More specifically, with continued reference to FIG. 1, a word line module 110, and more specifically, a word line 112 of word line module 110 should align directly to center 108 of pattern 107.

However, conventional overlay control can only align to physical layers, and thus conventional overlay control is not able to align a physical layer (e.g., a conductive layer) to a pattern (e.g., pattern 107) formed via multi-patterning photolithography. More specifically, a displacement error (e.g., active line layer 102 to AC layer 104 displacement error) may occur in a multi-patterning process, and thus aligning to either active line layer 102 or AC layer 104 may cause a displacement of a pattern (e.g., pattern 107) formed via the multi-patterning process.

Figure 2:
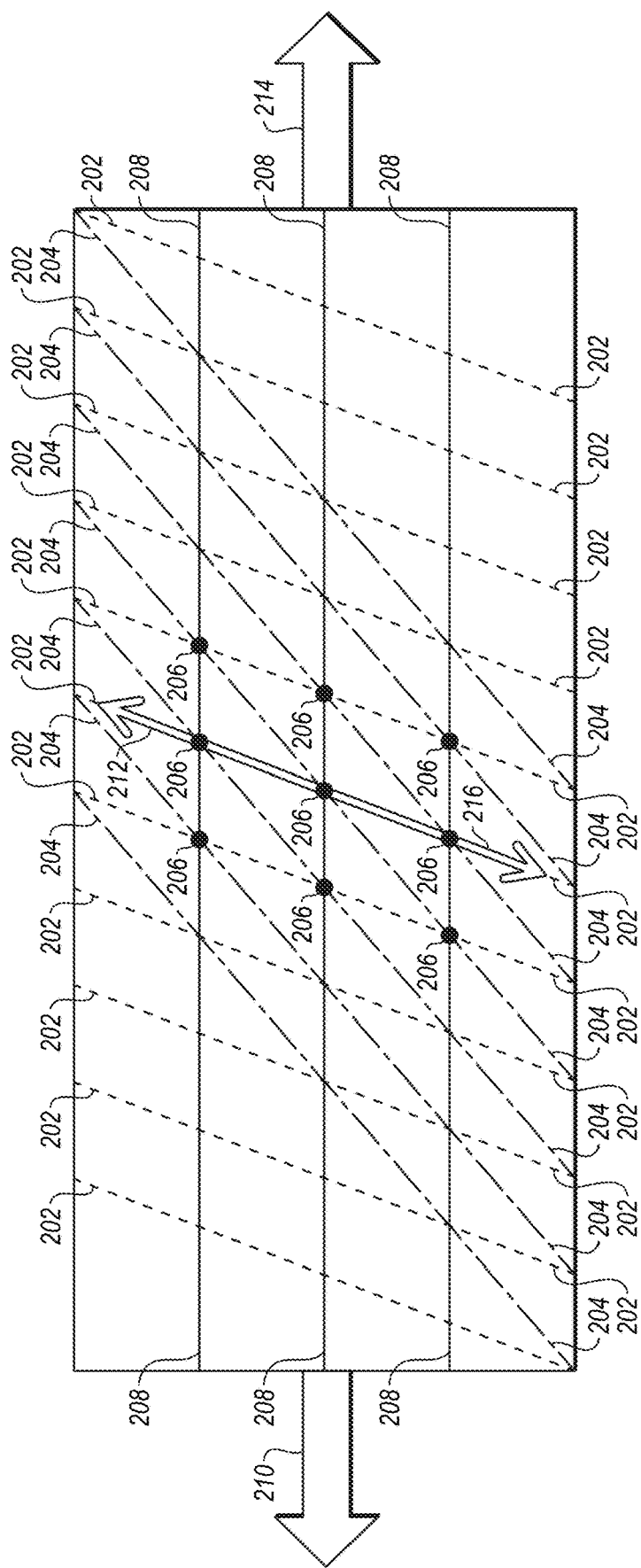
FIG. 2 depicts a number of layers and a pattern, and a displacement of the pattern due to a displacement error associated with the number of layers.

More specifically, with reference to FIG. 2, an example showing a displacement error and displacement of a pattern will now be described. FIG. 2 illustrates a layer, such as an active line layer (e.g., active line layer 102 of FIG. 1), represented via lines 202 (also referred to herein as "layer 202"). FIG. 2 further illustrates a layer, such as an active chop layer (e.g., AC layer 104 of FIG. 1), represented via lines 204 (also referred to herein as "layer 204"). Moreover, at each intersection of line 202 and line 204, a pattern center 206 may exist. It is noted that FIG. 2 only depicts nine pattern centers, however a pattern center may exist at each intersection of line 202 and line 204. FIG. 2 further illustrates conductive lines (e.g., word lines) 208, wherein each conductive line 208 is aligned to a pattern center 206.

For example, during one or more multi-patterning operations forming layer 202 and layer 204, a misalignment (also referred to herein as a "displacement error") between layer 202 and layer 204 (i.e., in a direction depicted by arrow 210) may occur. This displacement error may cause each pattern center 206 to be displaced (i.e., in a direction depicted by arrow 212). As another example, during one or more multi-patterning operations, another displacement error between layer 202 and layer 204 (i.e., in a direction depicted by arrow 214) may occur. This displacement error may cause pattern center 206 to be displaced (i.e., in a direction depicted by arrow 216).

Figure 3:
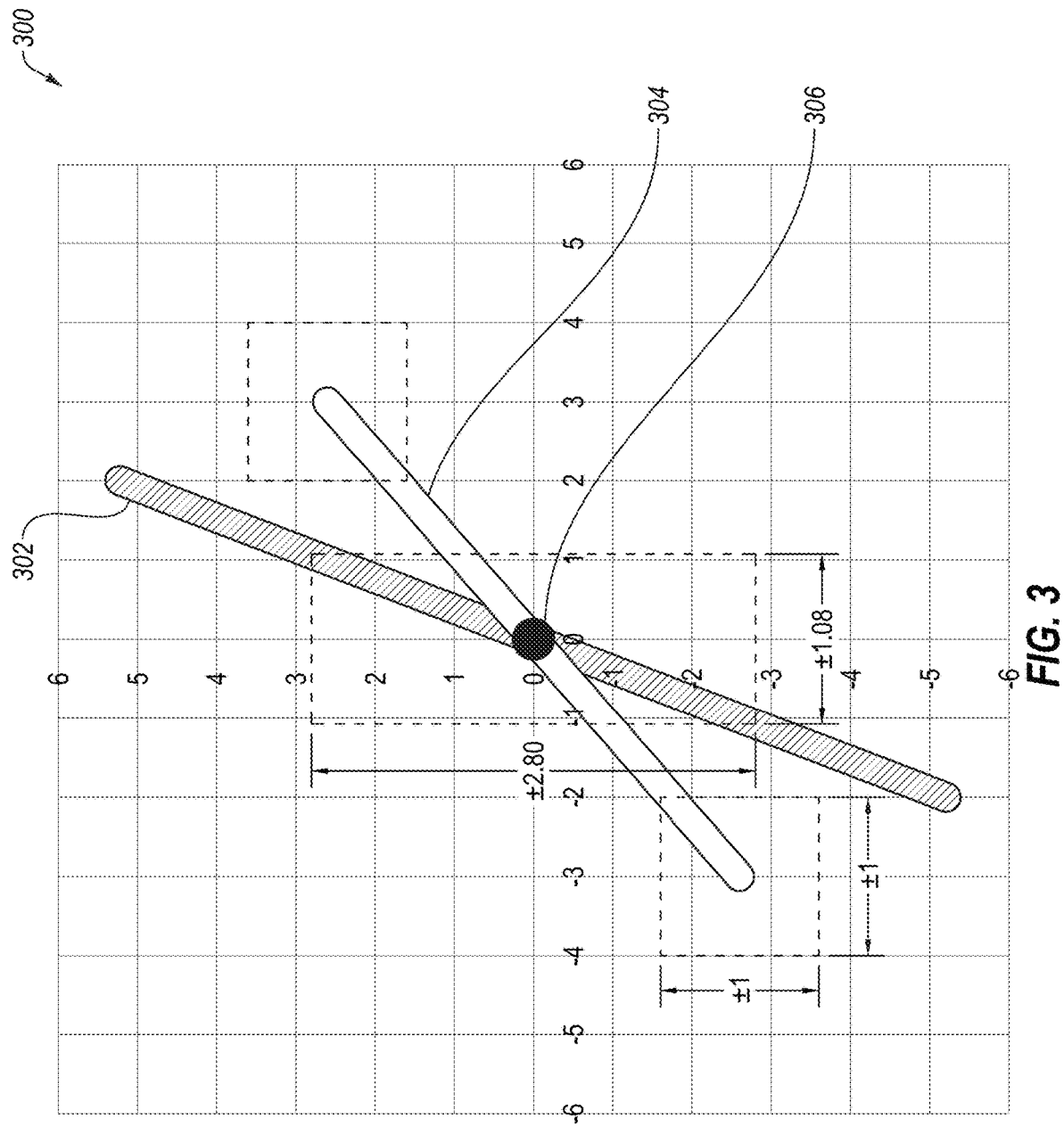
FIG. 3 includes a plot illustrating displacement of a physical layer and displacement of a center of a pattern.

Further, an amount of displacement between layer 202 and layer 204 may not be equal to an amount of displacement of pattern center 206. For example, FIG. 3 depicts a graph 300 including two physical layers and a pattern center, which is formed via one or more multi-patterning operations. More specifically, FIG. 3 illustrates a layer 302, a layer 304, and a pattern center 306. In this example, if layer 302 is displaced +/−1 nm, pattern center 306 may be displaced +/−1.08 nm in the x-direction and/or +/−2.80 nm in the y-direction. Thus, as will be appreciated, there is not a linear relationship between a displacement error associated with layer 302 and layer 304 and a displacement of a pattern center caused by the displacement error associated with layer 302 and layer 304.

Further, in conventional semiconductor fabrication methods involving only a single layer, if a misalignment occurs in, for example, an X-Y direction (i.e., a 2-D coordinate system), values to be corrected are the same as measured error values (e.g., values measured via a measurement tool). With reference to FIGS. 4A and 4B, a conventional method of correcting misalignments of a single layer (i.e., formed via photolithography) is described more fully. FIG. 4A includes a plot 400 showing a number of registration error measurement values, and FIG. 4B includes a plot 410 showing a number of correction values associated with the error measurement values shown in plot 400. For example, if a measured error is (−2, −1) (i.e., −2 nm in the X direction and −1 nm in the Y direction) (i.e., as identified by reference numeral 402 of FIG. 4A), in conventional methods, correction will be made with the same values (i.e., as identified by reference numeral 412 of FIG. 4B). Further, if a measured error is (2, 2) (i.e., 2 nm in the X direction and 2 nm in the Y direction) (i.e., as identified by reference numeral 404 of FIG. 4A), correction will be made with the same values (i.e., as identified by reference numeral 414 of FIG. 4B). In other words, if a measured error value is E, a correction is made with value E, in the opposite direction. However, this solution in inflexible and may not always be accurate.

Various embodiments of the disclosure relate to aligning a physical layer to a pattern (also referred to herein as a "virtual layer") formed via multi-patterning photolithography (e.g., via one or more multi-patterning operations). More specifically, some embodiments relate to forming a pattern (i.e., via one or more multi-patterning operations) and thereafter, aligning another physical layer to the pattern. More specifically, some embodiments relate to forming a pattern based on at least two physical layers, determining a displacement error between the at least two physical layers, calculating a center position of the pattern based on the displacement error, determining a registration (e.g., a registration vector) between the center position and a third physical layer based on a number of measurable vectors, and aligning the third physical layer to the center position of the pattern based on the determined registration.

As described more fully herein, various embodiments of the present disclosure provide a technical solution to one or more problems that arise from technology that could not reasonably be performed by a person, and various embodiments disclosed herein are rooted in computer technology in order to overcome the problems and/or challenges described above. Further, at least some embodiments disclosed herein may improve computer-related technology by allowing computer performance of a function not previously performable by a computer.

Various embodiments of the present disclosure are described with reference to a pattern generated based on two layers, however the embodiments are not so limited. Rather, the embodiments disclosed herein may be applicable to aligning a physical layer to a pattern formed via a combination of any number of layers (e.g., via double-patterning, triple-patterning, quadruple-patterning, or any other multi-patterning operations). Further, although various embodiments are described with reference to an X-Y coordinate system, the disclosure is not so limited, and it will be appreciated that other coordinate systems (e.g., orthogonal coordinate system, non-orthogonal coordinate system, polar coordinate system, a coordinate system based on three or more arbitrate angle axle, without limitation) may be used in carrying out various embodiments.

Figure 5B:
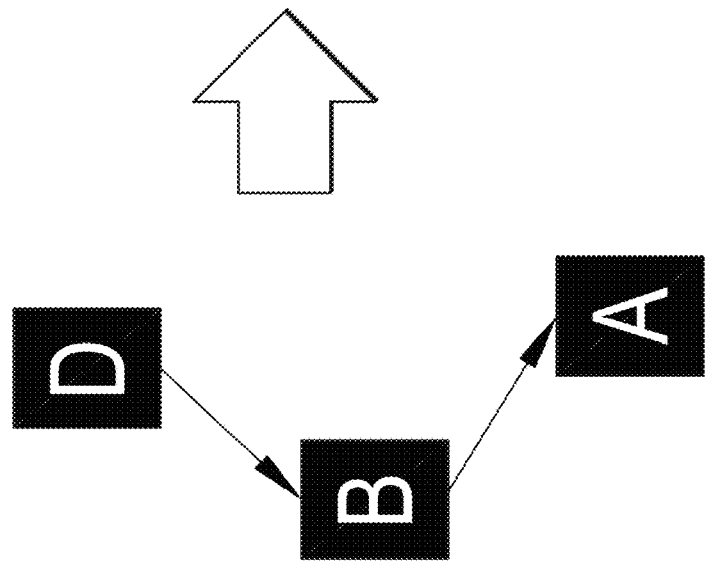
FIG. 5B illustrates two layers, a pattern formed via a combination of the two layers, and a layer to be aligned to the pattern, in accordance with various embodiments of the present disclosure.
Figure 5A:
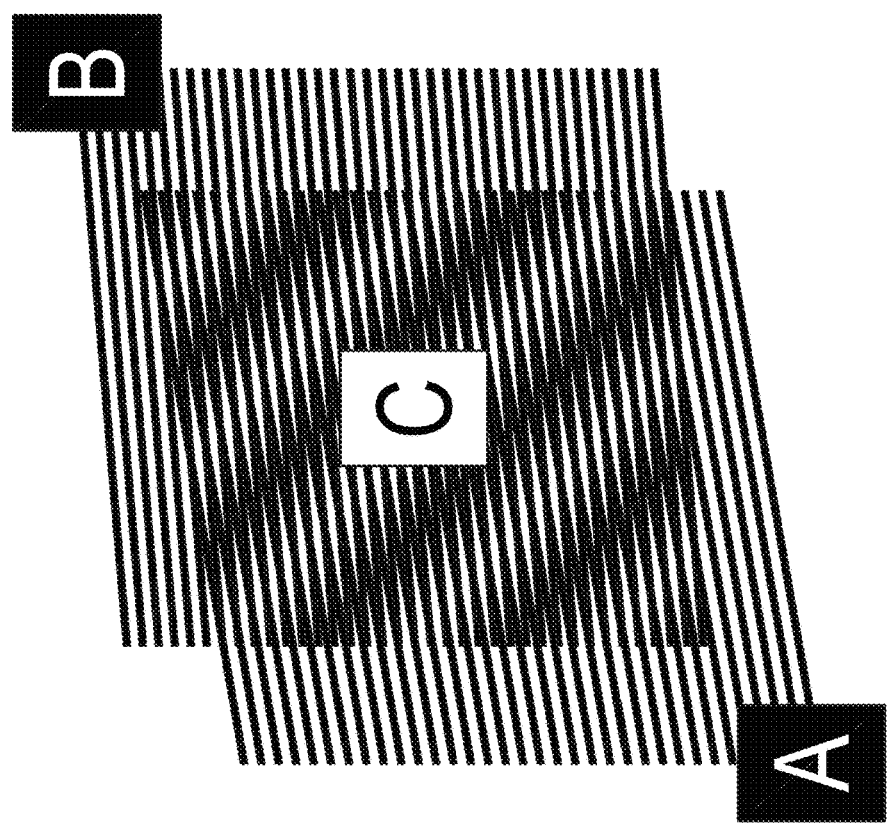
FIG. 5A depicts a pattern formed by a combination of two layers.

FIG. 5A depicts a layer A and a layer B, and a pattern C formed by a combination of layer A and layer B (i.e., via multi-patterning photolithography). FIG. 5B illustrates that a layer D may be aligned to the combination of layer A and layer B, which is equivalent to layer D aligning to a pattern (also referred to herein as a "virtual layer") C. For example, layer A of FIGS. 5A and 5B may include an active line layer (e.g., active line layer 102 of FIG. 1) or any other type of layer, layer B of FIGS. 5A and 5B may include an active chop layer (e.g., AC layer 104 of FIG. 1) or any other type of layer, pattern C of FIGS. 5A and 5B may include an active area (AA) pattern (e.g., pattern 107 of FIG. 1) or any other pattern (i.e., formed via multi-patterning photolithography), and layer D of FIG. 5B may include a conductive layer, such as a word line (e.g., word line 112 of FIG. 1), a digit line, a bit contact (BC), or any other type of layer.

According to various embodiments, as described more fully below, a displacement vector (also referred to herein as a "misalignment vector" or a "registration vector") between two physicals (e.g., layer A and layer B (e.g., a displacement vector $\overline{BA}$)) may be determined based on a one or more pattern angles associated with the two physical layers (e.g., angle θa and/or angle θb, see e.g., FIG. 9 and/or FIG. 10). Further, as described more fully below, according to some embodiments, a position vector of a pattern (e.g., pattern C), formed via one or more multi-patterning operations involving the two physical layers, may be determined based on the displacement vector between the two physical layers (e.g., displacement from layer B to layer A (e.g., displacement vector $\overline{BA}$)). Further, in some embodiments, a registration (i.e., a relative position vector) from a third layer (e.g., layer D) to the pattern (e.g., pattern C) may be determined based on one or more measurable vectors associated with the two physical layers and/or the third layer (e.g., the displacement vector from layer B to layer A (i.e., displacement vector $\overline{BA}$), a registration vector from layer A to layer D (i.e., a registration vector $\overline{AD}$), and/or a registration vector from layer B to layer D (i.e., a registration vector $\overline{BD}$)). Further, according to various embodiments, the determined registration (i.e., registration from layer D to virtual layer C) may be used to align the third layer (e.g., layer D) to the pattern (e.g., pattern C) (e.g., in a semiconductor fabrication process).

As described more fully below, a registration vector Reg (i.e., shown in equation (1)), which is used for determining alignment (i.e., registration) to a pattern (i.e., generated via a multi-patterning process involving n layers), is based on measurable error vectors $(\xi_n, \eta_n)$ and a transformation matrix including component values ("components") (i.e., a, b, c, and d), which are based on geometric information of one or more layers used to form the pattern. Registration vector Reg is provided via the following equation:

$$Reg = \sum \begin{pmatrix} a_n & b_n \\ c_n & d_n \end{pmatrix} \begin{pmatrix} \xi_n \\ \eta_n \end{pmatrix}; \quad (1)$$

wherein ξ and η are measured error values, $$\begin{pmatrix} a & b \\ c & d \end{pmatrix}$$

is the transformation matrix, and n represents the nth layer (e.g., two layers, three layers, four layers, five layers, or more) for a measured alignment of registration data of a multi-patterning operation.

According to various embodiments, as described more fully below, if a measured error (also referred to herein as "misalignment," "displacement," or "deviation") is (x, y), a value to be corrected may be A(x, y), wherein A represents the transformation matrix (i.e., of equation (1)).

Figure 6:
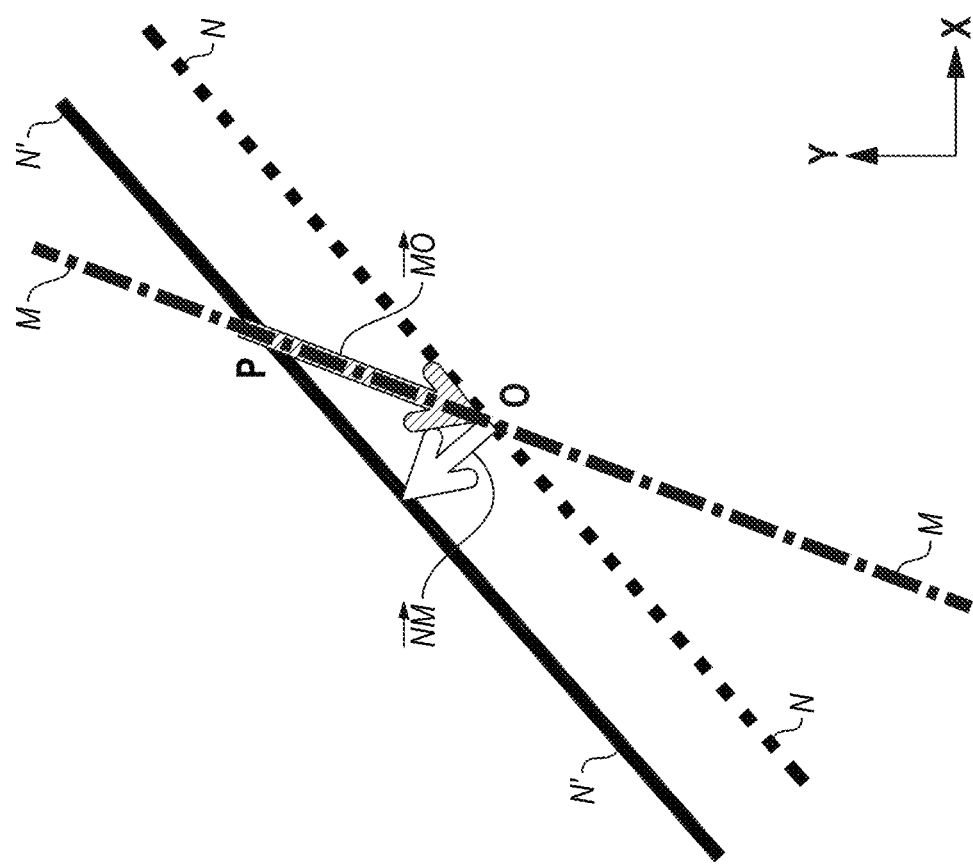
FIG. 6 includes a plot illustrating example layers and vectors used in an example of aligning a layer to a pattern, according to various embodiments of the present disclosure.

With reference to FIG. 6, an example of determining a center position of a pattern (e.g., an active area pattern), will now be described. FIG. 6 depicts a layer M, which may include a physical layer. As a specific example, layer M may include an active line layer (e.g., layer A shown in FIG. 5A). Further, FIG. 6 depicts a layer N, which may also include a physical layer. As a specific example, layer N may include an active chop (AC) layer (e.g., layer B shown in FIG. 5A). In a multi-patterning process, due to layer-to-layer displacement between layer M and layer N, layer N may move from an ideal position to an actual position. In FIG. 6, layer N is a layer depicted at an ideal position, and layer N' is the layer depicted at an actual position.

In this example, it is assumed that layer M is an anchor layer (i.e., layer M remains at an ideal position (e.g., 0, 0)). A position vector of layer M (i.e., vector $\overline{OM}$) is zero. Further, a position of a pattern (e.g., a pattern formed via one or more multi-patterning operations involving layer M and layer N) may be moved from an ideal position (indicated by origin O) to an actual position (indicated by reference letter P) due to layer-to-layer displacement between layer N and layer M (i.e., displacement vector $\overline{NM}$). Further, assuming registration back to origin O, an offset vector for the center position of the pattern may be defined as a vector $\overline{PO}$. To define the pattern as a root of a registration tree (e.g., N>M>P), vector $\overline{PO}$ may be defined as the position vector for the pattern. Vector $\overline{PO}$ may be equivalent to vector $\overline{PM}$. The registration vector for the pattern may be determined according to the following equation:

$$\overline{NP} = \overline{NM} - \overline{PM} = \overline{NM} + \overline{MP}. \quad (2)$$

Further, position vector $\overline{PO}$ may be determined based on displacement vector $\overline{NM}$. Accordingly, based on equation (1), position vector $\overline{PO}$ (i.e., $$\begin{pmatrix} x' \\ y' \end{pmatrix}$$

may be defined as follows:

$$\begin{pmatrix} x' \\ y' \end{pmatrix} = \begin{pmatrix} a & b \\ c & d \end{pmatrix} \begin{pmatrix} \Delta X \\ \Delta Y \end{pmatrix}; \quad (3)$$

wherein $$\begin{pmatrix} \Delta X \\ \Delta Y \end{pmatrix}$$

is displacement vector $\overline{N}M$, and a, b, c, and d are component values of the transformation matrix.

Accordingly, a center of the pattern is known based on position vector $\overline{P}O$, which is determined based on misalignment vector $\overline{N}M$ (i.e., the misalignment between layer M and layer N) and a transformation matrix (i.e., including component values based on a pattern angle of layer M (e.g., relative to the x-axis) and/or a pattern angle of layer N (e.g., relative to the x-axis)). As described more fully below, the center of the pattern may be used to determine a registration between the center of the pattern and a physical layer to be aligned to the pattern. Further, using the determined registration (i.e., registration between the center of the pattern and the physical layer to be aligned to the pattern), the physical layer may be aligned to the center of the pattern (e.g., in a semiconductor fabrication process).

Figures 7A, 7B:
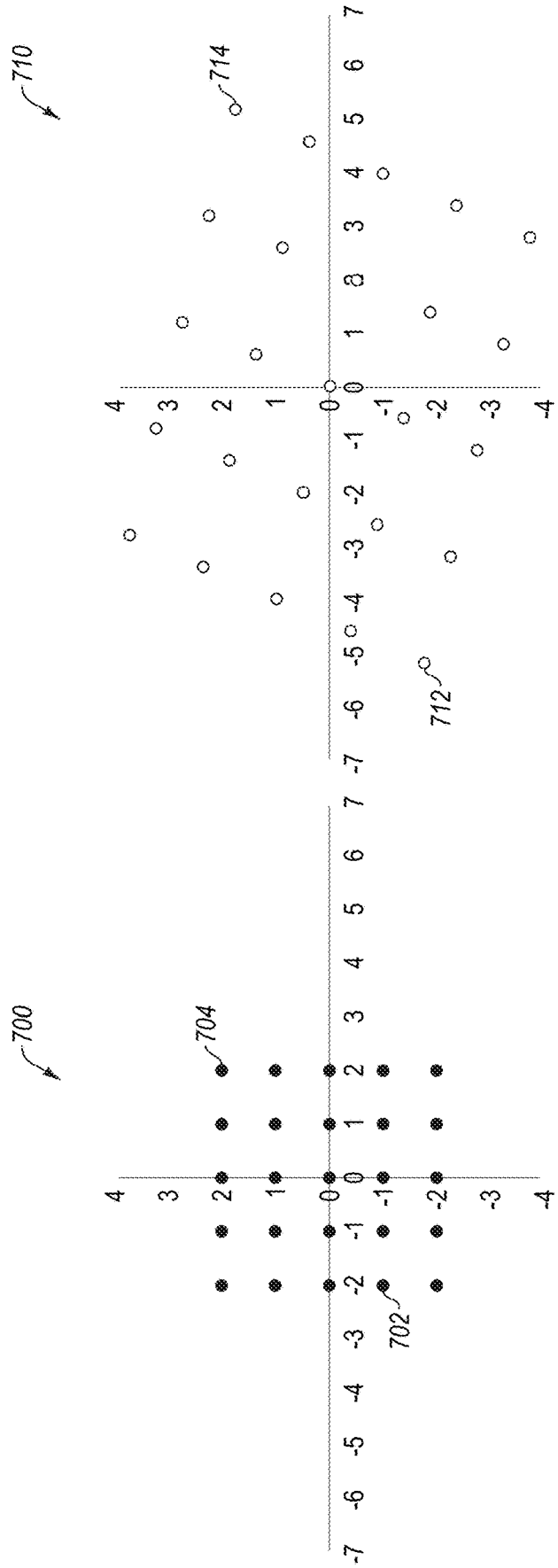
FIG. 7A depicts a plot including example measured error values.
FIG. 7B depicts a plot including example correction values for the measured error values shown in FIG. 7A, in accordance with various embodiments of the present disclosure.

FIG. 7A shows a plot 700 including measured error values (e.g., (x, y)), and FIG. 7B shows a plot 710 include correction values (e.g., A(x, y), wherein A is a transformation matrix). More specifically, plot 700 includes a number of measured error values (i.e., displacement error values), and plot 710 depicts a number of correction values associated with the measured error values of plot 700 and determined according to various embodiments disclosed more fully below. For example, if a measured error value is −2 nm in the x-direction (i.e., ΔX) and −1 nm in the y-direction (i.e., ΔY) (i.e., as identified by reference numeral 702 of FIG. 7A), a correction value (i.e., as identified by reference numeral 712 of FIG. 7B) (i.e.

$$\begin{pmatrix} x' \\ y' \end{pmatrix}$$

associated with the measured error value may be determined based on the measured error value and a transformation matrix (e.g., based on equation (3)). As another example, if a measured error value is 2 nm in the x-direction and 2 nm in the y-direction (i.e., as identified by reference numeral 704 of FIG. 7A), a correction value (i.e., as identified by reference numeral 714 of FIG. 7B) associated with the measured error value may be determined based on the measured error value and a transformation matrix (e.g., based on equation (3)).

FIG. 8A is a plot 800 including a number of example measured error values 802 (i.e., displacement error values) and associated correction values 804 determined via various embodiments disclosed herein. More specifically, measured error values 802 are measured based on a misalignment from layer B to layer A (e.g., see FIG. 5A)). For example, measured error values 802 may be measured via one or more measurement tools. Further, in this example, based on equation (3) above, correction values 804 for aligning layer D to pattern C (see FIG. 5B) formed via layer A and layer B (e.g., see FIG. 5A) may be provided by $$\begin{pmatrix} a & b \\ c & d \end{pmatrix} \begin{pmatrix} BAX \\ BAY \end{pmatrix},$$

wherein in this example, a=0.5, b=−0.575581, c=1.303030, and d=−1.5, and $$\begin{pmatrix} BAX \\ BAY \end{pmatrix}$$

are measured error values 802 (i.e., displacement vector $\overline{B}A$ in the x and y directions). As described more fully below, component values a, b, c, and d may be determined via one or more pattern angles associated with layer A and layer B.

As shown in plot 800, for a measured error value 802 of approximately −2 nm in the x-direction and 2 nm in the y-direction, the associated correction value 804 is approximately −4 nm in the x-direction and approximately −3.6 in the y-direction. Further, for a measured error value 802 of approximately 2 nm in the x-direction and 0 nm in the y-direction, the associated correction value 804 is approximately 2.8 nm in the x-direction and approximately 2.5 in the y-direction. As will be appreciated, correction values 804 may determine, or may be used to determine, a center of the pattern.

FIG. 8B is a plot 850 including example measured error values 852 (i.e., displacement error values) and associated correction values 854 determined via various embodiments disclosed herein. More specifically, measured error values 852 are measured based on a misalignment from layer B to layer A (e.g., see FIG. 5A)). For example, measured error values 852 may be measured via one or more measurement tools. Further, in this example, based on equation (3) above, correction values 854 for aligning layer D to pattern C (see FIG. 5B) may be provided by $$\begin{pmatrix} a & b \\ c & d \end{pmatrix} \begin{pmatrix} BAX \\ BAY \end{pmatrix},$$

wherein in this example, a=1.5, b=−0.575581, c=1.303030, and d=−0.5, and $$\begin{pmatrix} BAX \\ BAY \end{pmatrix}$$

are measured error values 852 (i.e., displacement vector $\overline{B}A$ in the x and y directions). As described more fully below, component values a, b, c, and d may be determined via one or more pattern angles associated with layer A and layer B.

As shown in plot 850, for a measured error value 852 of approximately −2 nm in the x-direction and 2 nm in the y-direction, the associated correction value 854 is approximately −6.1 nm in the x-direction and approximately −1.6 nm in the y-direction. Further, for a measured error value 852 of approximately 1 nm in the x-direction and 1 nm in the y-direction, the associated correction value 854 is approximately 2 nm in the x-direction and approximately 1.8 nm in the y-direction. As will be appreciated, correction values 854 determine, or may be used to determine, a center of the pattern.

Further, in the example described with reference to FIGS. 8A and 8B, to align a physical layer (e.g., physical layer D) to the pattern (e.g., pattern C; see FIG. 5B), a registration vector Reg (i.e., based on equation (1)) may be determined via the following equation:

$$Reg = DC = \begin{pmatrix} -0.5 & 0.575581 \\ -1.303030 & 1.5 \end{pmatrix} \begin{pmatrix} DBx \\ DBy \end{pmatrix} + \begin{pmatrix} 1.5 & -0.575581 \\ 1.30303 & -0.5 \end{pmatrix} \begin{pmatrix} DAx \\ DAy \end{pmatrix}. \quad (4)$$

With reference to a plot 900 shown in FIG. 9, an example operation for aligning a layer to a pattern, in accordance with various embodiments of the present disclosure, will now be described. Plot 900 depicts a line 902, which represents layer A of FIG. 5A (also referred to as an "anchor layer"), and a line 906, which represents layer B of FIG. 5A (also referred to as a "complement layer"). In this example, for explanation purposes, line 902 will be referred to as layer A, and line 906 will be referred to as layer B. FIG. 9 further depicts an origin O.

Figure 9:
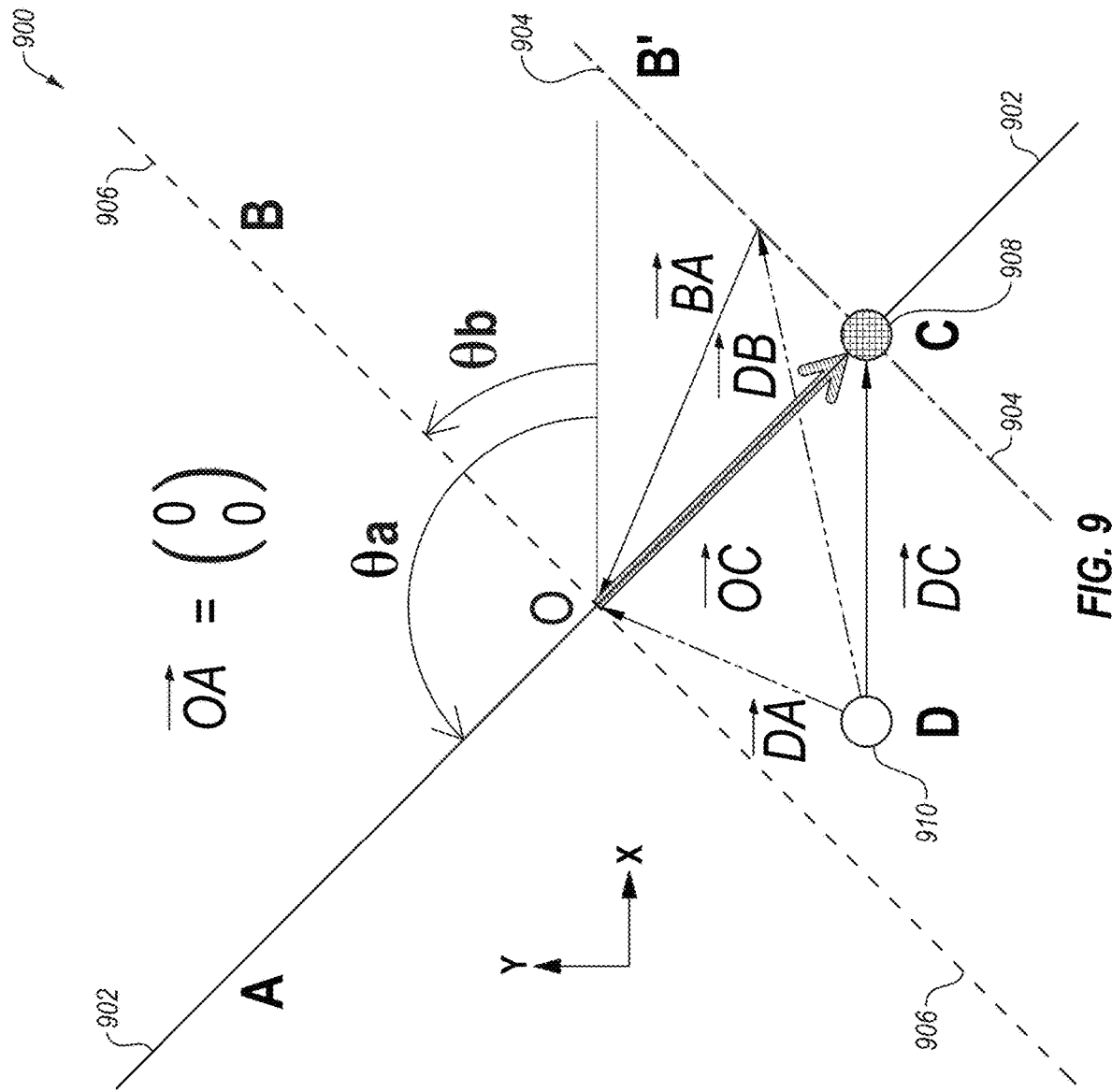
FIG. 9 includes a plot illustrating example layers and vectors used in another example of aligning a layer to a pattern, according to various embodiments of the present disclosure.

Each of layer A and layer B shown in FIG. 9 are located at an ideal position, however, due to process variations, layer B may be offset from an ideal position. Thus, FIG. 9 further depicts a line 904, which represents layer B at an actual position (i.e., offset from the ideal position). For explanation purposes, line 904 will be referred to as layer B'. Further, a point 908 in FIG. 9 represents a center of a pattern formed by layer A and layer B (i.e., via multi-patterning photolithography), and a point 910 represents a center of a layer (i.e., a physical layer, such as layer D in FIG. 5B) to be aligned to point 908. For explanation purposes, point 908 will be referred to as a center position of target pattern C, and point 910 will be referred to as layer D. Plot 900 further depicts an angle θa (i.e., an angle from an x-axis to line 902) and an angle θb (i.e., an angle from the x-axis to line 904).

To determine geometric relationships of the layers shown in FIG. 9, each layer may be defined as a linear function according to the following equations:

For layer A: $y = ax$, wherein slope $a = \arctan(\theta a)$; (5)

For layer B: $y = bx$, wherein slope $b = \arctan(\theta b)$; (6)

For layer B': $y - BAy = b(x - BAx)$, wherein displacement vector $\overline{BA} = (BAx, BAy)$. (7)

Further, equations (8)-(13) provided below (also referred to as "simultaneous equations") may be used to calculate a coordinate of a crossing point between layer A (i.e., at origin O) and layer B with displacement vector $\overline{BA}$ (also referred to herein as "position vector," "misalignment vector," "displacement vector," or "registration vector"), as provided by equation (14).

$x = (BAy - bBAx)/(a - b)$; (8)

$y = a(BAy - bBAx)/(a - b)$; (9)

$x = -b/(a-b)*BAx + b/(a-b)*BAy$; (10)

$y = -ab/(a-b)*BAx = a/(a-b)*BAy$; (11)

$x = 1/(a-b)\{-bBAx + BAy\}$; (12)

$y = 1/(a-b)\{-abBAx + aBAy\}$; (13)

$$\begin{pmatrix} x \\ y \end{pmatrix} = \frac{1}{a-b} \begin{pmatrix} -b & 1 \\ -ab & a \end{pmatrix} \begin{pmatrix} BAx \\ BAy \end{pmatrix}. \quad (14)$$

In this example, equation (14) is equal to a vector $\overline{CO}$ that is opposite of position vector $\overline{OC}$, which is determined based on displacement vector $\overline{BA}$. Displacement vector $\overline{BA}$ is equal to a vector $\overline{BO}$ that is opposite of a position vector $\overline{OB}$. Thus, position vector $\overline{OC}$ is equal to vector $-\overline{CO}$.

Further, position vector $\overline{OC}$, which may provide a position of the center position of pattern C (e.g., center 108 of pattern 107 of FIG. 1), may be calculated as a function of displacement vector $\overline{BA}$, which defines the relative position from layer B to layer A. More specifically, position vector $\overline{OC}$ may be calculated as follows:

$$\overline{OC} = -\overline{CO} = -\frac{1}{a-b}\begin{pmatrix} -b & 1 \\ -ab & a \end{pmatrix}\begin{pmatrix} BAx \\ BAy \end{pmatrix}. \quad (15)$$

$$\overline{OC} = \frac{1}{a-b}\begin{pmatrix} b & -1 \\ ab & -a \end{pmatrix}\begin{pmatrix} BAx \\ BAy \end{pmatrix}. \quad (16)$$

Position vector $\overline{OC}$ may then be used to determine how to align a physical layer (e.g., layer D) to pattern C (e.g., the center of pattern C). More specifically, a registration vector (also referred to herein as "position") $\overline{DC}$ may be determined from two of three measurable vectors (e.g., vector $\overline{BA}$, vector $\overline{DA}$, and vector $\overline{DB}$) associated with the three physical layers. For example, registration vector $\overline{DC}$ may be determined as follows:

$\overline{DC} = \overline{DA} + \overline{AC}$; (17)

$\overline{DC} = \overline{DA} + \overline{AO} + \overline{OC}$; (18)

$\overline{DC} = \overline{DA} - \overline{OA} + \overline{OC}$; (19)

$\overline{DC} = \overline{DA} + \overline{OC}$; wherein $\overline{OA} = 0$. (20)

Further, substituting equation (16) into equation (20), provides equation (21):

$$\begin{pmatrix} DCx \\ DCy \end{pmatrix} = \begin{pmatrix} DAx \\ DAy \end{pmatrix} + \frac{1}{a-b}\begin{pmatrix} b & -1 \\ ab & -a \end{pmatrix}\begin{pmatrix} BAx \\ BAy \end{pmatrix} \quad (21)$$

Moreover, vector $\overline{DA}$ may be divided into vector $\overline{DB}$ and vector $\overline{BA}$ to provide equation (22):

$$\begin{pmatrix} DAx \\ DAy \end{pmatrix} = \begin{pmatrix} DBx \\ DBy \end{pmatrix} + \begin{pmatrix} BAx \\ BAy \end{pmatrix}. \quad (22)$$

Furthermore, substituting equation (22) into equation (21) provides equations (23)-(27):

$$\begin{pmatrix} DCx \\ DCy \end{pmatrix} = \begin{pmatrix} DBx \\ DBy \end{pmatrix} + \begin{pmatrix} BAx \\ BAy \end{pmatrix} + \frac{1}{a-b}\begin{pmatrix} b & -1 \\ ab & -a \end{pmatrix}\begin{pmatrix} BAx \\ BAy \end{pmatrix}; \quad (23)$$

$$\begin{pmatrix} DCx \\ DCy \end{pmatrix} = \begin{pmatrix} DBx \\ DBy \end{pmatrix} + \begin{pmatrix} 1 & 0 \\ 0 & 1 \end{pmatrix}\begin{pmatrix} BAx \\ BAy \end{pmatrix} + \frac{1}{a-b}\begin{pmatrix} b & -1 \\ ab & -a \end{pmatrix}\begin{pmatrix} BAx \\ BAy \end{pmatrix}; \quad (24)$$

wherein $$\begin{pmatrix} 1 & 0 \\ 0 & 1 \end{pmatrix}$$

is an identity matrix;

$$\begin{pmatrix} DCx \\ DCy \end{pmatrix} = \begin{pmatrix} DBx \\ DBy \end{pmatrix} + \frac{1}{a-b}\begin{pmatrix} a-b & 0 \\ 0 & a-b \end{pmatrix}\begin{pmatrix} BAx \\ BAy \end{pmatrix} + \frac{1}{a-b}\begin{pmatrix} b & -1 \\ ab & -a \end{pmatrix}\begin{pmatrix} BAx \\ BAy \end{pmatrix}; \quad (25)$$

$$\begin{pmatrix} DCx \\ DCy \end{pmatrix} = \begin{pmatrix} DBx \\ DBy \end{pmatrix} + \frac{1}{a-b}\begin{pmatrix} a-b+b & -1 \\ ab & a-b-a \end{pmatrix}\begin{pmatrix} BAx \\ BAy \end{pmatrix}; \quad (26)$$

$$\begin{pmatrix} DCx \\ DCy \end{pmatrix} = \begin{pmatrix} DBx \\ DBy \end{pmatrix} + \frac{1}{a-b}\begin{pmatrix} a & -1 \\ ab & -b \end{pmatrix}\begin{pmatrix} BAx \\ BAy \end{pmatrix}; \quad (27)$$

Further, vector $\overline{BA}$ may be divided into vector $\overline{DA}$ and vector $\overline{DB}$ to provide equations (29) and (30):

$$\begin{pmatrix} BAx \\ BAy \end{pmatrix} = \begin{pmatrix} BDx \\ BDy \end{pmatrix} + \begin{pmatrix} DAx \\ DAy \end{pmatrix}; \quad (28)$$

$$\begin{pmatrix} BAx \\ BAy \end{pmatrix} = -\begin{pmatrix} DBx \\ DBy \end{pmatrix} + \begin{pmatrix} DAx \\ DAy \end{pmatrix}. \quad (29)$$

Moreover, substituting equation (29) into equation (27) provides equations (30)-(35):

$$\begin{pmatrix} DCx \\ DCy \end{pmatrix} = \begin{pmatrix} DBx \\ DBy \end{pmatrix} + \frac{1}{a-b}\begin{pmatrix} a & -1 \\ ab & -b \end{pmatrix}\begin{pmatrix} -DBx+DAx \\ -DBy+DAy \end{pmatrix}; \quad (30)$$

$$\begin{pmatrix} DCx \\ DCy \end{pmatrix} = \begin{pmatrix} 1 & 0 \\ 0 & 1 \end{pmatrix}\begin{pmatrix} DBx \\ DBy \end{pmatrix} - \frac{1}{a-b}\begin{pmatrix} a & -1 \\ ab & -b \end{pmatrix}\begin{pmatrix} DBx \\ DBy \end{pmatrix} + \frac{1}{a-b}\begin{pmatrix} a & -1 \\ ab & -b \end{pmatrix}\begin{pmatrix} DAx \\ DAy \end{pmatrix}; \quad (31)$$

$$\begin{pmatrix} DCx \\ DCy \end{pmatrix} = \frac{1}{a-b}\begin{pmatrix} a-b & 0 \\ 0 & a-b \end{pmatrix}\begin{pmatrix} DBx \\ DBy \end{pmatrix} - \frac{1}{a-b}\begin{pmatrix} a & -1 \\ ab & -b \end{pmatrix}\begin{pmatrix} DBx \\ DBy \end{pmatrix} + \frac{1}{a-b}\begin{pmatrix} a & -1 \\ ab & -b \end{pmatrix}\begin{pmatrix} DAx \\ DAy \end{pmatrix}; \quad (32)$$

$$\begin{pmatrix} DCx \\ DCy \end{pmatrix} = \frac{1}{a-b}\begin{pmatrix} a-b-a & 1 \\ -ab & a-b+b \end{pmatrix}\begin{pmatrix} DBx \\ DBy \end{pmatrix} + \frac{1}{a-b}\begin{pmatrix} a & -1 \\ ab & -b \end{pmatrix}\begin{pmatrix} DAx \\ DAy \end{pmatrix}; \quad (33)$$

$$\begin{pmatrix} DCx \\ DCy \end{pmatrix} = \frac{1}{a-b}\begin{pmatrix} -b & 1 \\ -ab & a \end{pmatrix}\begin{pmatrix} DBx \\ DBy \end{pmatrix} + \frac{1}{a-b}\begin{pmatrix} a & -1 \\ ab & -b \end{pmatrix}\begin{pmatrix} DAx \\ DAy \end{pmatrix}; \quad (34)$$

$$\begin{pmatrix} DCx \\ DCy \end{pmatrix} = \frac{1}{a-b}\begin{pmatrix} a & -1 \\ ab & -b \end{pmatrix}\begin{pmatrix} DAx \\ DAy \end{pmatrix} + \frac{1}{a-b}\begin{pmatrix} -b & 1 \\ -ab & a \end{pmatrix}\begin{pmatrix} DBx \\ DBy \end{pmatrix}. \quad (35)$$

Further, registration vector $\overline{DC}$ is provided by equation (36):

$$Reg = DC = \frac{1}{a-b}\begin{pmatrix} a & -1 \\ ab & -b \end{pmatrix}\begin{pmatrix} DAx \\ DAy \end{pmatrix} + \frac{1}{a-b}\begin{pmatrix} -b & 1 \\ -ab & a \end{pmatrix}\begin{pmatrix} DBx \\ DBy \end{pmatrix}. \quad (36)$$

It is noted that registration vector $\overline{DC}$ may be determined from two of three measurable vectors (e.g., two of $\overline{BA}$, $\overline{DA}$, and $\overline{DB}$), as provided above.

As will be appreciated, in this example, $$\begin{pmatrix} DAx \\ DAy \end{pmatrix}$$

is the misalignment vector between layer A and layer D, and $$\begin{pmatrix} DBx \\ DBy \end{pmatrix}$$

is the misalignment vector between layer B and layer D. Based on registration vector $\overline{DC}$, layer D (e.g., a word line) may be aligned to pattern C. For example, assuming layer D is a word line (e.g., word line 112 of FIG. 1) and pattern C is an active area pattern (e.g., pattern 107 of FIG. 7), layer D may be aligned the center of pattern C (e.g., center 108 of FIG. 1) based on registration vector $\overline{DC}$. Further, according to some embodiments, registration vector $\overline{DC}$ may be used to make one or more adjustments to a semiconductor process and/or system (e.g., fabrication system 1330 in FIG. 13) for fabrication of other semiconductor devices.

Another example operation for aligning a layer to a pattern, in accordance with various embodiments, will now be described with reference to a plot 1000 shown in FIG. 10. Plot 1000 depicts a line 1002, which represents a first layer (e.g., layer A of FIG. 5B) (also referred to as an "anchor layer"), and a line 1006, which represents a second layer (e.g., layer B of FIG. 5B) (also referred to as a "complement layer"). In this example, for explanation purposes, line 1002 will be referred to as layer Q, and line 1006 will be referred to as layer R. FIG. 10 further depicts an origin O.

Figure 10:
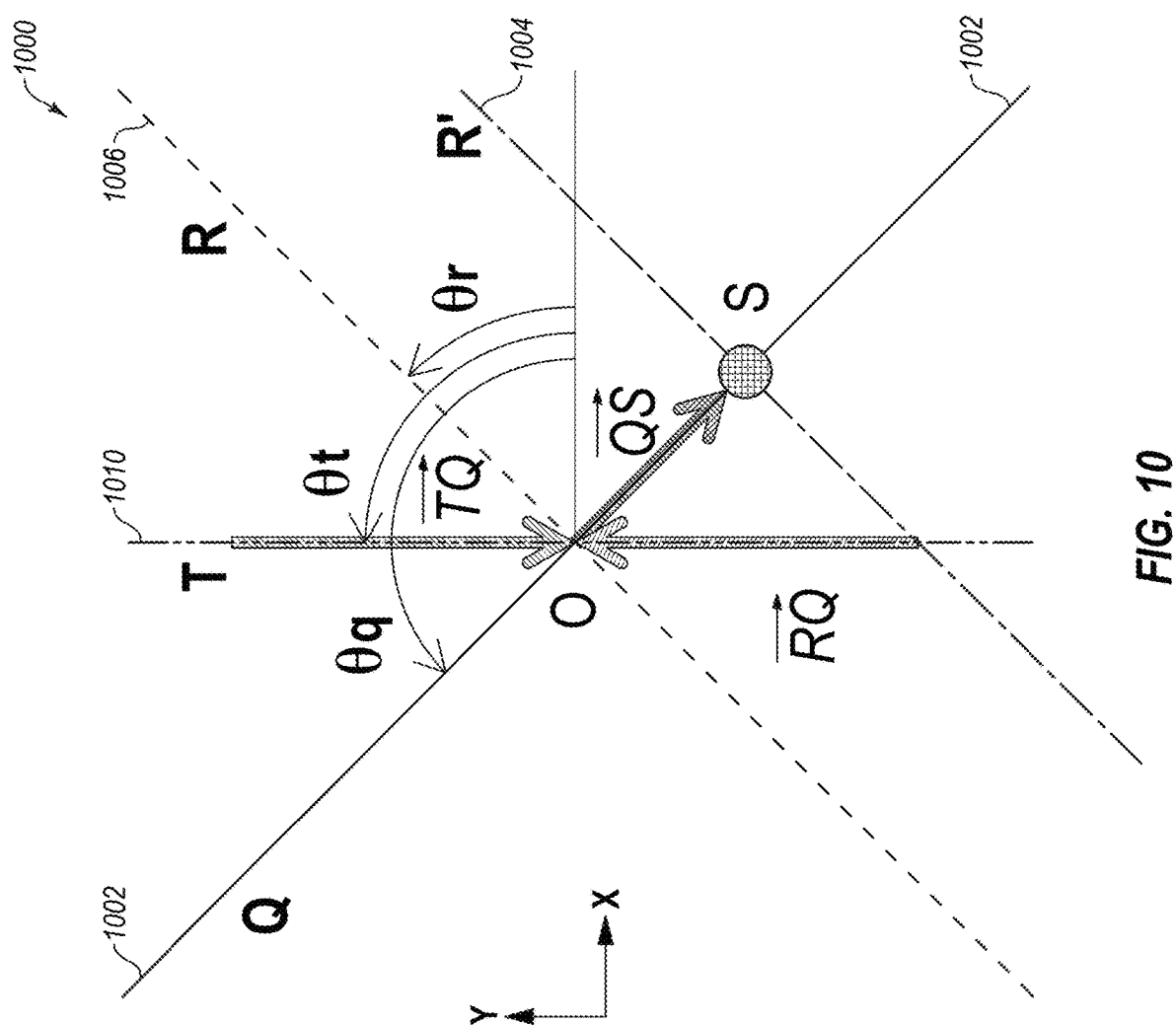
FIG. 10 includes a plot illustrating example layers and vectors used in yet another example of aligning a layer to a pattern, in accordance with various embodiments of the present disclosure.

Each of layer Q and layer R shown in FIG. 10 are located at an ideal position, however, due to process variation, layer R may be offset from an ideal position. FIG. 10 further depicts a line 1004, which represents layer R at an actual position (i.e., offset from the ideal position). For explanation purposes, line 1004 will be referred to as layer R'. Further, a point S in FIG. 10 represents a center of a pattern formed by layer Q and layer R (i.e., via multi-patterning photolithography), and a line 1010, which represents a layer T to be aligned to a center of a pattern S. Plot 1000 further depicts angle θq (i.e., an angle from an x-axis to line 1002, an angle θr (i.e., an angle from the x-axis to line 1006), and an angle θt (i.e., an angle from the x-axis to line 1010).

To determine geometric relationships of the layers shown in FIG. 10, each layer may be defined as a linear function according to the following equations:

For layer Q: $y=qx$, wherein $q=\arctan(\theta q)$; (37)

For layer R: $y=rx$, wherein $r=\arctan(\theta r)$; (38)

For layer $R'$: $y-R\overline{Q}y=r(x-RQx)$, wherein displacement vector $\overline{RQ}=(RQx,RQy)$; (39)

For layer $T$: $y=tx$, wherein $t=\arctan(\theta t)$; (40)

Furthermore, based on layer Q and layer R', a vector $\overline{SO}$ may be determined as a function of a misalignment vector $\overline{RQ}$, as shown in equation (41):

$$\overline{SO} = \frac{1}{q-r}\begin{pmatrix}-r & 1\\ -qr & q\end{pmatrix}\begin{pmatrix}RQx\\ RQy\end{pmatrix};$$ (41)

Anchor layer Q is fixed at origin O, and therefore vector $\overline{QS}$, which is used to determine the center position of pattern S (e.g., center 108 of pattern 107 of FIG. 1), is equal to vector $-\overline{SO}$, as shown in equation (42):

$$\overline{QS} = \frac{1}{q-r}\begin{pmatrix}r & -1\\ qr & -q\end{pmatrix}\begin{pmatrix}RQx\\ RQy\end{pmatrix};$$ (42)

Misalignment vector $\overline{QS}$ and measurable misalignment vector $\overline{TQ}$ may then be used to determine how to align a physical layer (e.g., layer T) to the center of pattern S. More specifically, based on equation (1), misalignment vector $\overline{TS}$ may be provided by equation (43):

$$Reg = \overline{TS} = \overline{TQ} + \overline{QS} = \begin{pmatrix}TQx\\ TQy\end{pmatrix} + \frac{1}{q-r}\begin{pmatrix}r & -1\\ qr & -q\end{pmatrix}\begin{pmatrix}RQx\\ RQy\end{pmatrix}.$$ (43)

As will be appreciated, in this example, $$\begin{pmatrix}TQx\\ TQy\end{pmatrix}$$

is the misalignment vector between layer Q and layer T, and $$\begin{pmatrix}TRx\\ TRy\end{pmatrix}$$

is the misalignment vector between layer R and layer T. Based on misalignment vector $\overline{TS}$, layer T (e.g., a word line, digit line, or a bit contact) may be aligned to pattern S. For example, assuming layer T is a word line (e.g., word line 112 of FIG. 1) and pattern S is an active area pattern (e.g., pattern 107 of FIG. 7), layer T may be aligned the center of pattern S (e.g., center 108 of FIG. 1) based on misalignment vector $\overline{TS}$.

Figure 11:
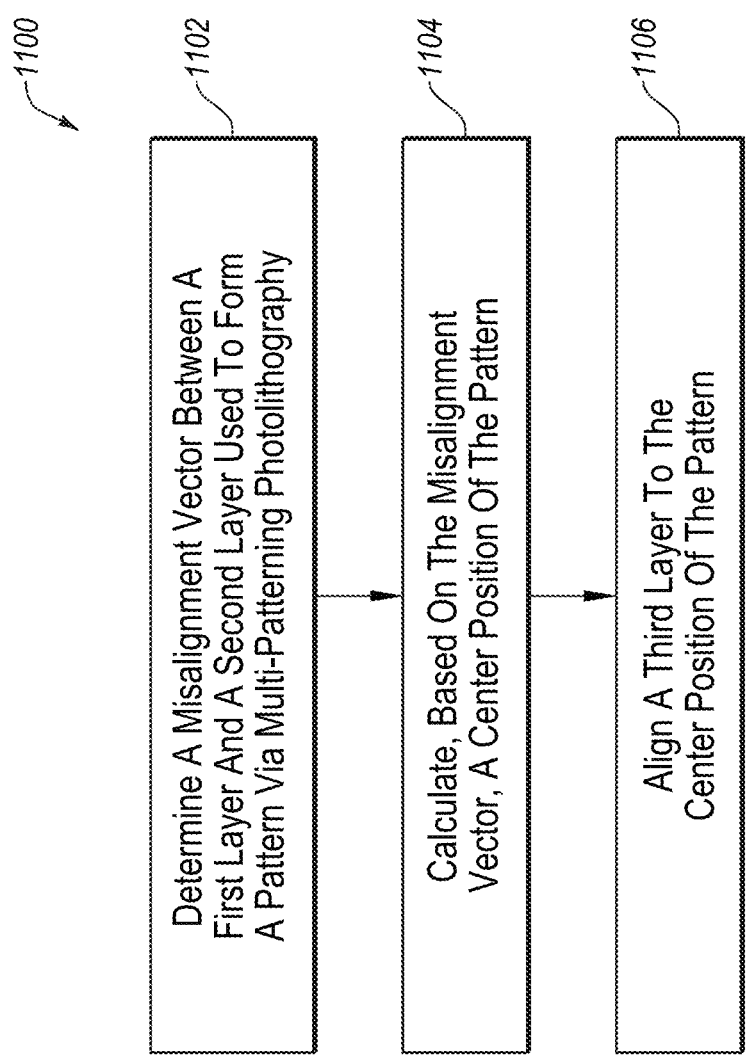
FIG. 11 is a flowchart of an example method of aligning a layer to a pattern, in accordance with various embodiments of the present disclosure.

FIG. 11 is a flowchart of an example method 1100 of aligning a physical layer to a pattern formed via multi-patterning photolithography, in accordance with various embodiments of the disclosure. Method 1100 may be arranged in accordance with at least one embodiment described in the present disclosure. Method 1100 may be performed, in some embodiments, by a device or system, such as system 1200 of FIG. 12, processing system 1300 of FIG. 13, or another device or system. Although illustrated as discrete blocks, various blocks may be divided into additional blocks, combined into fewer blocks, or eliminated, depending on the desired implementation.

Method 1100 may begin at block 1102, where a misalignment vector between a first layer and a second layer used to form a pattern via a multi-patterning operation is determined, and method 1100 may proceed to block 1104. For example, the misalignment vector (e.g., misalignment vector $\overline{BA}$) may be determined via one or more angles associated with the first layer and/or second layer (e.g., angle θa and/or angle θb; see e.g., FIG. 9 and/or FIG. 10). Further, for example, the first layer may include an active line layer (e.g., active line layer 102 of an STI module; see FIG. 1), and the second layer may include an active chop layer (e.g., AC layer 104 of the STI module; see FIG. 1). Further, for example, the alignment vector may be determined via a processor (e.g., a processor 1210 of FIG. 12).

At block 1104, a center position of the pattern may be calculated based on the misalignment vector, and method 1100 may proceed to block 1106. More specifically, for example, the center position of the pattern (e.g., center position 108 of pattern 107; see FIG. 1) may be determined based on the misalignment vector (e.g., misalignment vector $\overline{BA}$ of FIG. 9) and a transformation matrix associated with at least one of the first layer and the second layer. Yet more specifically, the center position of the pattern may be determined via multiplying the misalignment vector (i.e., the relative position between the first layer and the second layer) by a transformation matrix (e.g., as shown in equation (3)). Further, the component values (also referred to herein as "components") may be determined via a pattern angle of the first layer and/or a pattern angle of the second layer (e.g., angle θa and/or angle θb, see e.g., FIG. 9 and/or FIG. 10). Further, for example, the center position of the pattern may be determined via a processor (e.g., processor 1210 of FIG. 12).

At block 1106, a third layer may be aligned to the center position of the pattern. For example, the third layer may include a conductive layer, such as a bit contact, a digit line, or a word line. Further, for example, the third layer may be aligned based on a determined registration vector between the third layer and the center position of the pattern. For example, the registration vector may be determined via two or more measurable vectors. More specifically, for example, the registration vector may be determined via the misalignment vector between the first layer and the second layer and at least one of a misalignment vector between the third layer and the first layer and a misalignment vector between the third layer and the second layer. Yet more specifically, in some embodiments, the registration vector may be determined via multiplying each of the two or more measurable vectors by an associated transformation matrix and summing products of the multiplications to generate the registration vector (e.g., according to equation (1)). Further, for example, the registration vector may be determined via a processor (e.g., processor 1210 of FIG. 12).

Modifications, additions, or omissions may be made to method 1100 without departing from the scope of the present disclosure. For example, the operations of method 1100 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, a method (e.g., method 1100) may include forming the pattern via one or more multi-patterning operations involving the first layer and the second layer. More specifically, in one example, the first layer may be formed via a multi-patterning operation, and the second layer may be formed via another multi-patterning operation. In these examples, these multi-patterning operations may form the pattern. In another example, the pattern may be formed via a single multi-patterning operation to form the first layer and the second layer. For example, alignment may be performed via a scanner or stepper to measure a position vector that refers to a reference grid. Further, a third layer may be processed based on a position vector of the first layer and the second layer.

Figure 12:
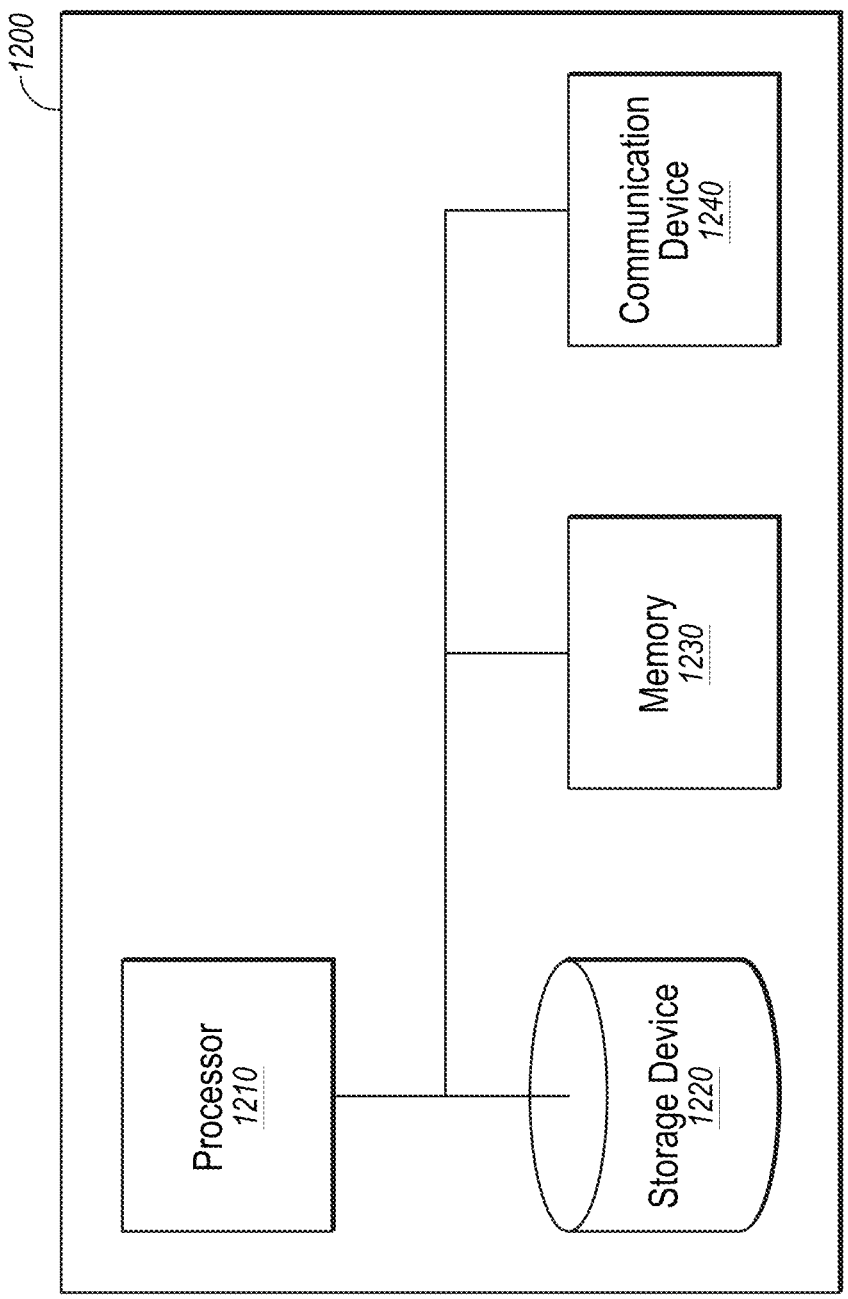
FIG. 12 is a block diagram of an example computing system, according to various embodiments of the present disclosure.

FIG. 12 illustrates an example system 1200, according to at least one embodiment described herein. System 1200 may include any suitable system, apparatus, or device configured carrying out one or more embodiments of the disclosure. System 1200 may include a processor 1210, a data storage 1220, a memory 1230, and a communication device 1240, which all may be communicatively coupled. Data storage 1220 may include various types of data, such as measured error values associated with a semiconductor process, position vectors and/or registration vectors, or other measurable vectors associated with one or more layers used in a semiconductor fabrication process, geometric information data for one or more the layers, and/or any other data related to determining a center position of a pattern formed via multi-patterning and/or aligning a physical layer to the pattern (e.g., the center of the pattern).

Generally, processor 1210 may include any suitable special-purpose or general-purpose computer, computing entity, or processing device including various computer hardware or software modules and may be configured to execute instructions stored on any applicable computer-readable storage media. For example, processor 1210 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 12, it is understood that processor 1210 may include any number of processors distributed across any number of network or physical locations that are configured to perform individually or collectively any number of operations described herein. In some embodiments, processor 1210 may interpret and/or execute program instructions and/or process data stored in data storage 1220, memory 1230, or data storage 1220 and memory 1230. In some embodiments, processor 1210 may fetch program instructions from memory 1230 and load the program instructions into memory 1230.

After the program instructions are loaded into memory 1230, processor 1210 may execute the program instructions, such as instructions to perform method 1100 (see FIG. 11) as described herein. For example, processor 1210 may determine a misalignment vector between a number of layers (e.g., a first layer and a second layer) used in a multi-patterning operation. Processor 1210 may also calculate, based on the misalignment vector, a position (e.g., a center position) of a pattern ("virtual layer"). Further, processor 1210 may determine how to align a third layer (or cause the third layer to be aligned) to the calculated position of the virtual layer.

Data storage 1220 and memory 1230 may include computer-readable storage media or one or more computer-readable storage mediums for carrying or having computer-executable instructions or data structures stored thereon. Such computer-readable storage media may be any available media that may be accessed by a general-purpose or special-purpose computer, such as processor 1210.

By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause processor 1210 to perform a certain operation or group of operations.

Communication device 1240 may include any component, device, system, or combination thereof that is configured to transmit or receive information over a network. In some embodiments, communication device 1240 may communicate with other devices at other locations, the same location, or even other components within the same system. For example, communication device 1240 may include a modem, a network card (wireless or wired), an infrared communication device, a wireless communication device (such as an antenna), and/or chipset (such as a Bluetooth device, an 802.6 device (e.g., Metropolitan Area Network (MAN)), a WiFi device, a WiMax device, cellular communication facilities, etc.), and/or the like. Communication device 1240 may permit data to be exchanged with a network and/or any other devices or systems.

Figure 13:
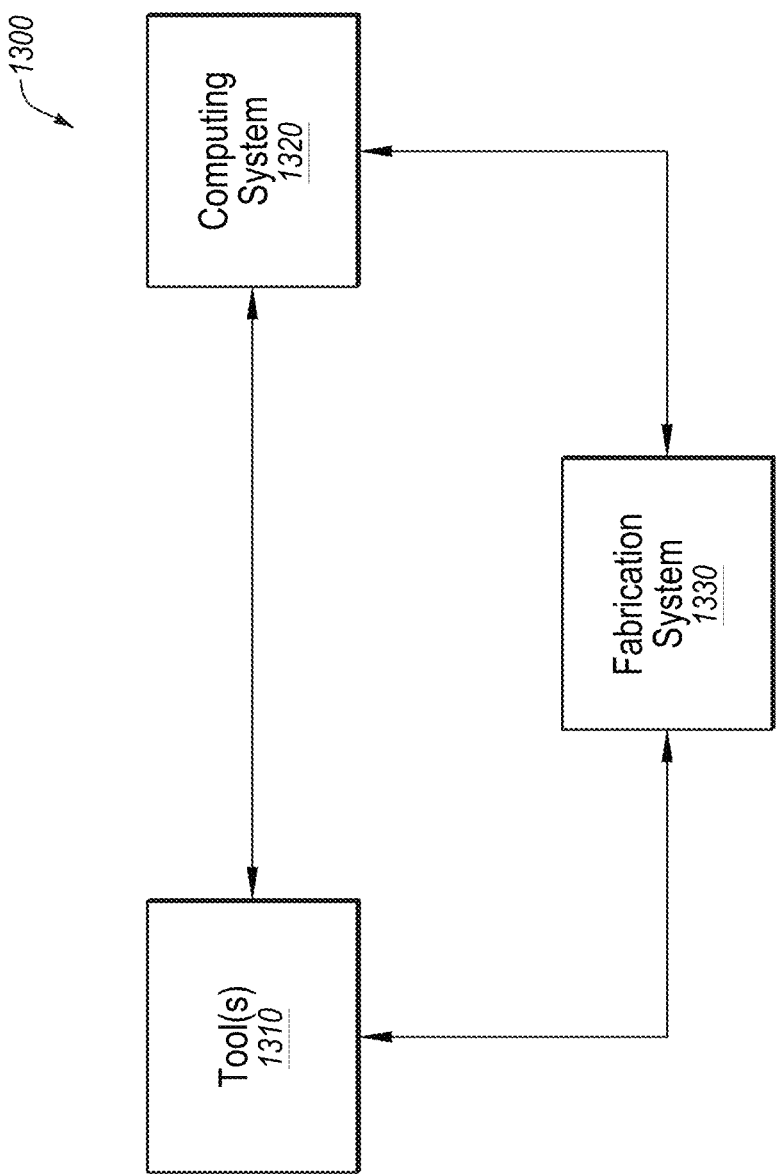
FIG. 13 is a block diagram of an example processing system including the example computing system of FIG. 12, in accordance with various embodiments of the present disclosure.

FIG. 13 depicts an example processing system 1300, according to various embodiments of the present disclosure. As illustrated, processing system 1300 includes one or more tools 1310, which may include one or more measurement tools configured to measure, for example, one or more displacement measurements (e.g., error values) associated with semiconductor fabrication. More specifically, tools 1310 may include a photo stepper and/or a scanner tool configured to measure alignment (i.e., position vector from an ideal position) and/or registration (e.g., position vector between layers).

Further, processing system 1300 further includes computing system 1320, which may include system 1200 of FIG. 12. Tools 1310 may be configured to provide one or more measurements to computing system 1320 for carrying out various embodiments disclosed herein. Although computing system 1320 is illustrated as being coupled to tools 1310, in some embodiments, computing system 1320 may include tools 1310. Further, processing system 1300 includes a fabrication system 1330, which may include, for example, one or more steppers for various semiconductor fabrication operations, such as photolithography, etching, cleaning, doping, and dicing, without limitation.

In some embodiments, computing system 1320 may be configured to provide information (e.g., data and/or instructions) to fabrication system 1330 for performing various semiconductor fabrication operations. In other words, for example, one or more operations performed via fabrication system 1330 may be based on one or more measurements taken via tools 1310 and/or operations performed via computing system 1320. Further, tools 1310 may perform measurements on devices (e.g., layers and/or patterns) formed via fabrication system 1330.

According to various embodiments disclosed herein, and in contrast to some conventional systems and methods, a position of a pattern may be determined based on a displacement error associated with at least two physical layers that formed the pattern, and a third physical layer may be aligned to the position of the pattern based on a determined registration between the position of the pattern and the third physical layer.

One or more embodiments of the present disclosure include a method of aligning a physical layer to a pattern. For example, a method may include determining a misalignment vector between a first layer and a second layer used to form a pattern via multi-patterning. The method may also include calculating, based on the misalignment vector between the first layer and the second layer, a center position of the pattern. Further, the method may include aligning a third layer to center position of the pattern.

According to another embodiment, a method may include aligning a physical layer to a virtual layer formed via multi-patterning photolithography. In this embodiment, the method includes forming a virtual layer via multi-patterning, and determining a displacement vector between at least two physical layers used to form the virtual layer. Further, the method may include determining a center of the virtual layer based on the displacement vector. Also, the method may include determining a registration vector between a third physical layer and the center of the virtual layer. Moreover, the method may include aligning a third physical layer to center of the virtual layer based on the registration vector.

Some embodiments of the present disclosure include computing system. The computing system may include one or more processors. The one or more processors may be configured to determine a registration vector between a first layer and a second layer used to form a pattern via multi-patterning. The one or more processors may be also configured to determine a position of the pattern based on the registration vector between the first layer and the second layer and a first transformation matrix associated with the first layer and the second layer. Further, the one or more processors may be configured to determine a registration vector between a third layer and the pattern based on two or more of the registration vector between the first layer and the second layer, a registration vector between the third layer and the first layer, and a registration vector between the third layer and the second layer.

As used herein, the term "semiconductor" should be broadly construed, unless otherwise specified, to include microelectronic and MEMS devices that may or may not employ semiconductor functions for operation (e.g., magnetic memory, optical devices, etc.).

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/of" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of aligning a physical layer to a pattern, the method comprising:
   determining a misalignment vector between a first layer and a second layer used to form a pattern via multi-patterning;

calculating, based on the misalignment vector between the first layer and the second layer, a center position of the pattern; and aligning a third layer to center position of the pattern.

2. The method of claim 1, wherein determining the misalignment vector comprises determining the misalignment vector between the first layer comprising an active line layer and the second layer comprising an active chop layer.

3. The method of claim 1, wherein calculating the center position of the pattern comprises calculating the center position of an active area pattern.

4. The method of claim 1, wherein aligning the third layer to the center position of the pattern comprises aligning one of a digit line, a bit contact, and a word line to the center position of the pattern.

5. The method of claim 1, wherein aligning comprises aligning the third layer to the center position of the pattern based on two or more misalignment vectors including the misalignment vector between the first layer and the second layer and at least one of a misalignment vector between the third layer and the first layer and a misalignment vector between the third layer and the second layer.

6. The method of claim 5, wherein aligning the third layer to the center position of the pattern based on the two or more misalignment vectors comprises:

multiplying each of the two or more misalignment vectors by an associated transformation matrix;

summing products of the multiplications to generate a registration vector between the third layer and the center position of the pattern; and aligning the third layer to the center position of the pattern based on the registration vector.

7. The method of claim 1, wherein aligning the third layer to the center position of the pattern comprises calculating a registration vector between the third layer and the center position of the pattern.

8. The method of claim 1, wherein calculating the center position of the pattern further comprises calculating the center position of the pattern based on a transformation matrix associated with the first layer and the second layer, components of the transformation matrix determined via at least one of a pattern angle of the first layer and a pattern angle of the second layer.

9. A method of aligning a physical layer to a virtual layer formed via multi-patterning, the method comprising:

forming a virtual layer via multi-patterning;

determining a displacement vector between at least two physical layers used to form the virtual layer;

determining a center of the virtual layer based on the displacement vector;

determining a registration vector between a third physical layer and the center of the virtual layer; and aligning the third physical layer to center of the virtual layer based on the registration vector.

10. The method of claim 9, wherein determining the registration vector between the third physical layer and the center of the virtual layer comprises determining the registration vector based on at least two measurable vectors associated with the at least two physical layers and the third physical layer.

11. The method of claim 9, wherein determining the registration vector between the third physical layer and the center of the virtual layer comprises determining the registration vector based on two or more displacement vectors including the displacement vector between at least two physical layers, a displacement vector between the third physical layer and a first layer of the at least two physical layers, and a displacement vector between the third physical layer and a second layer of the at least two physical layers.

12. The method of claim 9, wherein determining the registration vector between the third physical layer and the center of the virtual layer comprises determining the registration vector based on the displacement vector between at least two physical layers and at least one of a displacement vector between the third physical layer and a first layer of the at least two physical layers and a displacement vector between the third physical layer and a second layer of the at least two physical layers.

13. The method of claim 9, wherein determining the center of the virtual layer further comprises determining the center of the virtual layer based on a transformation matrix including components of the transformation matrix determined via at least one of a pattern angle of a first layer of the at least two physical layers and a pattern angle of a second layer of the at least two physical layers.

14. The method of claim 13, wherein determining the center of the virtual layer further comprises multiplying the transformation matrix by the displacement vector.

15. A system, comprising:

one or more processors configured to:

determine a registration vector between a first layer and a second layer used to form a pattern via one or more multi-patterning operations;

determine a position of the pattern based on the registration vector between the first layer and the second layer and a first transformation matrix associated with the first layer and the second layer; and determine a registration vector between a third layer and the pattern based on two or more of the registration vector between the first layer and the second layer, a registration vector between the third layer and the first layer, and a registration vector between the third layer and the second layer.

16. The system of claim 15, wherein the one or more processors further configured to align the third layer to the pattern based on the registration vector between the third layer and the position of the pattern.

17. The system of claim 15, wherein components of the first transformation matrix are based on at least one of a pattern angle of the first layer and a pattern angle of the second layer.

18. The system of claim 15, wherein the registration vector is determined based on the registration vector between the first layer and the second layer and a registration vector between the third layer and the first layer.

19. The system of claim 18, wherein the one or more processors further configured to:

multiply the registration vector between the first layer and the second layer by the first transformation matrix to generate a first product, the first transformation matrix including components based on at least one of a pattern angle of the first layer and a pattern angle of the second layer;

multiply the registration vector between the third layer and the first layer by a second transformation matrix to generate a second product, the second transformation matrix including components based on at least one of a pattern angle of the first layer and a pattern angle of the second layer; and sum the first product and the second product.

20. The system of claim 15, wherein the one or more processors are configured to determine the position of the pattern based on a position vector of the pattern determined via multiplying the registration vector between the first layer and the second layer by the first transformation matrix, the first transformation matrix including component values determined based on at least one of a pattern angle of the first layer and a pattern angle of the second layer.

21. A method of aligning a physical layer to a pattern, the method comprising:
   determining a displacement vector associated with a pattern formed via multi-patterning;
   determining a center position of the pattern based on the displacement vector; and
   determining a registration vector between a conductive layer and the center position of the pattern based on a number of measurable vectors.

22. The method of claim 21, further comprising aligning the conductive layer to the center position of the pattern based on the registration vector.

23. The method of claim 21, wherein determining the registration vector comprises determining the registration vector based on two or more measurable vectors associated with a first layer used to form the pattern, a second layer used to form the pattern, and the conductive layer.

24. The method of claim 23, wherein determining the registration vector based on the two or more measurable vectors comprises determining the registration vector based on the displacement vector and a registration vector between the conductive layer and either of the first layer or the second layer.

25. The method of claim 23, wherein determining the displacement vector comprises determining the displacement vector between the first layer and the second layer.

\* \* \* \* \*